United States Patent
Candelier et al.

(10) Patent No.: US 9,564,242 B2
(45) Date of Patent: *Feb. 7, 2017

(54) METHOD FOR CONTROLLING THE BREAKDOWN OF AN ANTIFUSE MEMORY CELL

(71) Applicant: STMicroelectronics SA, Montrouge (FR)

(72) Inventors: Philippe Candelier, Saint Mury Monteymond (FR); Joel Damiens, Le Touvet (FR); Elise Le Roux, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/832,802

(22) Filed: Aug. 21, 2015

(65) Prior Publication Data
US 2015/0364209 A1 Dec. 17, 2015

Related U.S. Application Data

(63) Continuation of application No. 13/887,167, filed on May 3, 2013, now Pat. No. 9,142,318.

(30) Foreign Application Priority Data

May 3, 2012 (FR) .................................. 12 54049

(51) Int. Cl.
*G11C 17/16* (2006.01)
*G11C 17/18* (2006.01)
*H01L 27/12* (2006.01)
*H01L 27/112* (2006.01)
*H01L 27/10* (2006.01)

(52) U.S. Cl.
CPC ............. *G11C 17/165* (2013.01); *G11C 17/18* (2013.01); *H01L 27/101* (2013.01); *H01L 27/11206* (2013.01)

(58) Field of Classification Search
CPC ...................................................... G11C 17/16
See application file for complete search history.

(56) References Cited

U.S. PATENT DOCUMENTS

| | | | |
|---|---|---|---|
| 5,008,855 A | 4/1991 | Eltoukhy et al. | |
| 5,668,751 A | 9/1997 | Sher et al. | |
| 5,684,732 A | 11/1997 | Sako | |
| 5,815,429 A * | 9/1998 | Sher ................ | G11C 17/18 327/525 |
| 5,818,749 A * | 10/1998 | Harshfield ........ | G11C 11/56 257/E27.004 |
| 6,529,038 B2 | 3/2003 | Lambertson | |
| 6,630,724 B1 * | 10/2003 | Marr ............... | G11C 17/16 257/530 |
| 7,031,209 B2 * | 4/2006 | Wang ............... | G11C 11/5692 365/189.09 |

(Continued)

*Primary Examiner* — Anthan Tran
*Assistant Examiner* — Mushfique Siddique
(74) *Attorney, Agent, or Firm* — Seed IP Law Group LLP

(57) ABSTRACT

A method for controlling the breakdown of an antifuse memory cell formed on a semiconductor substrate, including the steps of: applying a programming voltage; detecting a breakdown time; and interrupting the application of the programming voltage at a time following the breakdown time by a post-breakdown time.

14 Claims, 4 Drawing Sheets

(56) References Cited

U.S. PATENT DOCUMENTS

| | | | |
|---|---|---|---|
| 7,157,782 B1 * | 1/2007 | Shih | H01L 27/0203 257/50 |
| 2003/0218924 A1 | 11/2003 | Duval et al. | |
| 2005/0073024 A1 * | 4/2005 | Frey | H01L 23/5252 257/530 |
| 2006/0158923 A1 | 7/2006 | Namekawa et al. | |
| 2011/0075500 A1 * | 3/2011 | Kodama | G11C 17/16 365/225.7 |
| 2011/0108926 A1 | 5/2011 | Bahl | |
| 2013/0208525 A1 * | 8/2013 | Peng | G11C 17/16 365/96 |
| 2013/0229222 A1 | 9/2013 | Rountree | |

* cited by examiner

METHOD FOR CONTROLLING THE BREAKDOWN OF AN ANTIFUSE MEMORY CELL

BACKGROUND

Technical Field

The present disclosure relates to the field of memory cells, and more specifically of antifuse memory cells, that is, of memory cells having a storage element, which is non-conductive in its initial state and becomes conductive after programming.

Description of the Related Art

FIG. 1 shows an example of an antifuse memory cell 10. In the upper portion of a P-type semiconductor substrate 1 are delimited active areas 2, each of which is surrounded with an insulating ring 3. Insulating ring 3 is for example of the type currently called STI (Shallow Trench Insulation) in the art. The antifuse memory element 10 and its control elements are formed in each active area. The actual memory element 10 is formed of a very thin insulating layer 7 and a conductive pad 9 on the insulating layer 7. Insulating layer 7 is formed above a portion of the active area or P-type well 2. Two N-channel access transistors are formed in the active area to connect the region arranged under thin insulator 7 to a terminal called BL, which generally corresponds to a bit line terminal. First transistor 11, used for transfer, comprises an insulated gate 13 formed above the substrate between drain and source regions 14 and 15. Second transistor 21, used for reading, comprises an insulated gate 23 between drain and source regions 15 and 24. Region 24 is covered with a pad 25 connected to terminal BL.

A metallization 27 coupled with a P$^+$ region 29 formed in substrate 1 outside of the active areas has also been shown. Metallization 27 is connected to a generally grounded terminal BULK.

The memory cell has one or the other of two states according to whether insulator 7 effectively insulates conductor 9 from the substrate or to whether this insulator is made conductive by the flowing of a strong programming current. This programming current results from a programming voltage applied between a terminal HV connected to conductive layer 9 and terminal BL while transistors 11 and 21 are set to the on state.

FIG. 2 illustrates current $I_{HV}$ in the antifuse during the programming phase. First, during a time T1, which corresponds to the breakdown phase of the antifuse, the current varies slowly. Then, from the end of time T1, current $I_{HV}$ increases abruptly, and then remains substantially constant due to the current saturation of access transistors 11 and 21.

The performed tests show that time T1 is very variable, for example within a range from 100 ns to 10 μs, from one antifuse to another of a same wafer and for antifuse devices of different wafer batches, even for theoretically identical antifuses. Thus, in practice, many tests are performed and a time at least equal to the longest programming time detected during the tests is selected as the programming time. It can further be observed that the resistivity of antifuses programmed in this manner does not have a minimum and constant value.

BRIEF SUMMARY

An embodiment of the present disclosure is directed to a method for controlling the breakdown of an antifuse formed on a semiconductor substrate, comprising the steps of:
applying a programming voltage;
detecting a breakdown time; and
interrupting the application of the programming voltage at a time following the breakdown time by a post-breakdown time. This method ensures that a resistivity of a programmed antifuse has a minimum and constant value. In addition, the method is configured to decrease the programming time of antifuses.

According to an embodiment, the post-breakdown time is determined by previous tests for antifuses of determined characteristics.

According to an embodiment, the current generated in the substrate is compared with a first threshold to determine the end of the breakdown.

According to an embodiment, the breakdown voltage is provided by a current source with no current limitation and, after the first threshold has been exceeded, the value of the current generated in the substrate is compared with a second threshold reached in decreasing fashion.

According to an embodiment, the second threshold is selected to be equal to from 30 to 70% of the peak current at the time of the breakdown.

According to an embodiment, the method further comprises the step of interrupting the application of the programming voltage immediately after the crossing of the second threshold has been detected.

An embodiment provides a device for controlling the breakdown of an antifuse formed on a semiconductor substrate, above a well surrounded with a peripheral insulator, the lower surface of the well being laid on a buried layer of a conductivity type opposite to that of the well, comprising a detector of the current on a substrate terminal, and a comparator of the value of said current with a first threshold.

According to an embodiment, the device further comprises a comparator of the value of said current with a second threshold reached in decreasing fashion.

According to an embodiment, the device further comprises means for interrupting the application of the programming voltage after the second threshold has been reached.

The foregoing and other features and advantages will be discussed in detail in the following non-limiting description of specific embodiments in connection with the accompanying drawings.

DETAILED DESCRIPTION

The present inventors have found that, to obtain programmed antifuse memory cells having a resistivity of minimum and constant value, said fuses should be applied a programming voltage for a well-determined time adapted to each antifuse. Tests have shown that it was not desirable to interrupt the programming current at the end of above-mentioned time T1 in the prior art devices, but that the programming phase had to be extended for a post-breakdown time T2 after phase T1 to make sure that the antifuse has fully turned into a conductive element of minimum resistivity. Time T2, which may experimentally be determined for antifuses of same characteristics, is relatively constant (to within 10%) and is currently on the order of a few microseconds. Further, tests have shown that, if time T2 is exceeded, for example, by more than 50%, the resistivity of the programmed antifuses increases beyond the minimum value. Given the large above-mentioned dispersion of breakdown time T1, conventional methods—where a fixed time at least equal to the longest programming time detected during many tests is selected as the programming time—inevitably provide programmed antifuses which do not have a resistivity of constant and minimum value. This is due to the fact that the total programming time is then shorter (for antifuses having a long breakdown time) or longer (for antifuses having a short breakdown time) than optimal time T1+T2.

One embodiment of the present disclosure involves detecting the end of period T1 and applying the programming voltage to each antifuse to be programmed for time T1 plus time T2, which may have been determined experimentally by previous tests or which may have been determined on each programming, as will be discussed hereafter.

Figure 1:
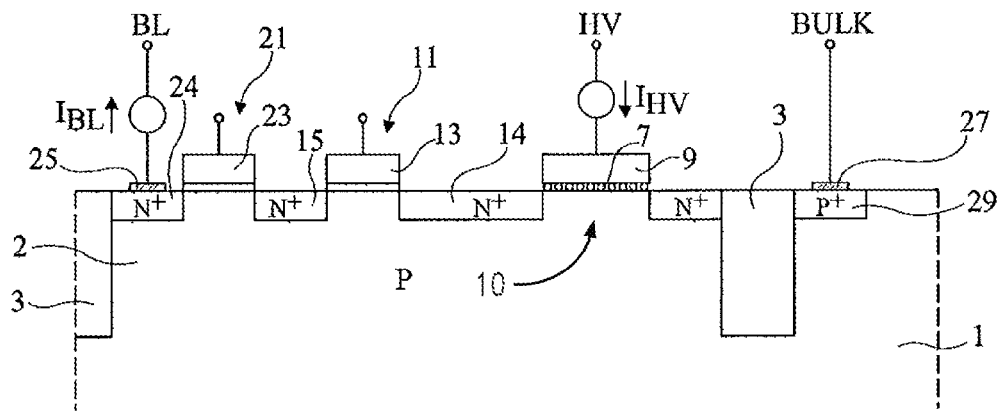
FIG. 1, previously described, shows an example of an antifuse memory cell.
Figure 3:
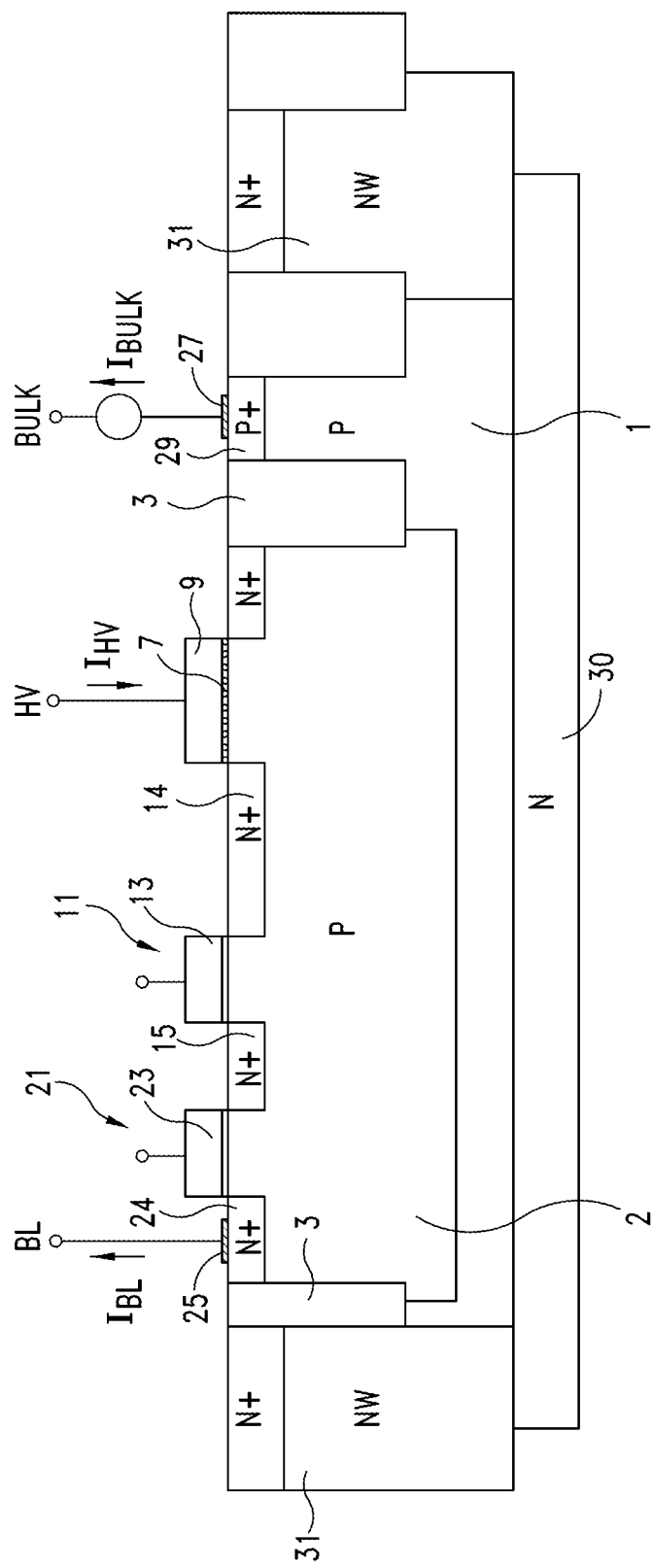
FIG. 3 shows an embodiment of an antifuse memory cell.

According to an embodiment, an antifuse memory cell such as illustrated in FIG. 3 is used. In FIG. 3, the same reference numerals as in FIG. 1 are used to designate the same elements. Further, in FIG. 3 as in FIG. 1, as usual in the representation of integrated circuits, the various elements and layers are not drawn to scale.

The same elements as those in FIG. 1 will not be described again. An important difference between the two drawings is that the device of FIG. 3 comprises an N-type buried layer 30 under each active area. The buried layer is contacted by a peripheral N-type wall 31 extending from the surface of the component. An N+ region may separate the surface of the component from the N-type wall. Further, means for measuring, during programming phases, output current $I_{BULK}$ when terminal BULK is grounded are provided.

Figure 4:
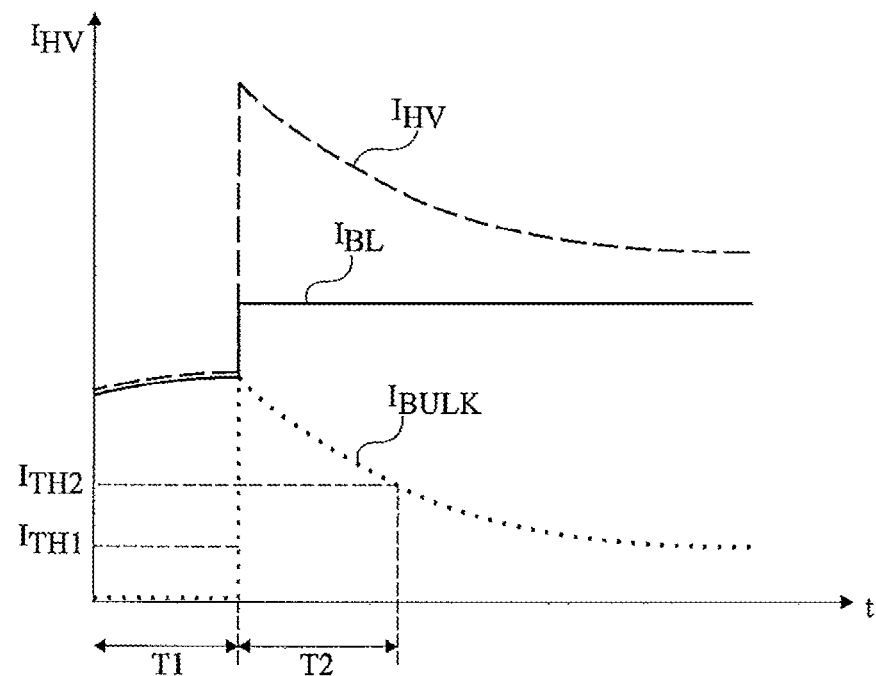
FIG. 4 shows current variations in an antifuse memory cell during the application of a programming voltage.

FIG. 4 is a current-vs.-time curve.

The shape of current $I_{HV}$ flowing in through terminal HV, of current $I_{BL}$ flowing out from terminal BL, and of current $I_{BULK}$ flowing out through terminal BULK has been indicated in this drawing.

Figure 2:
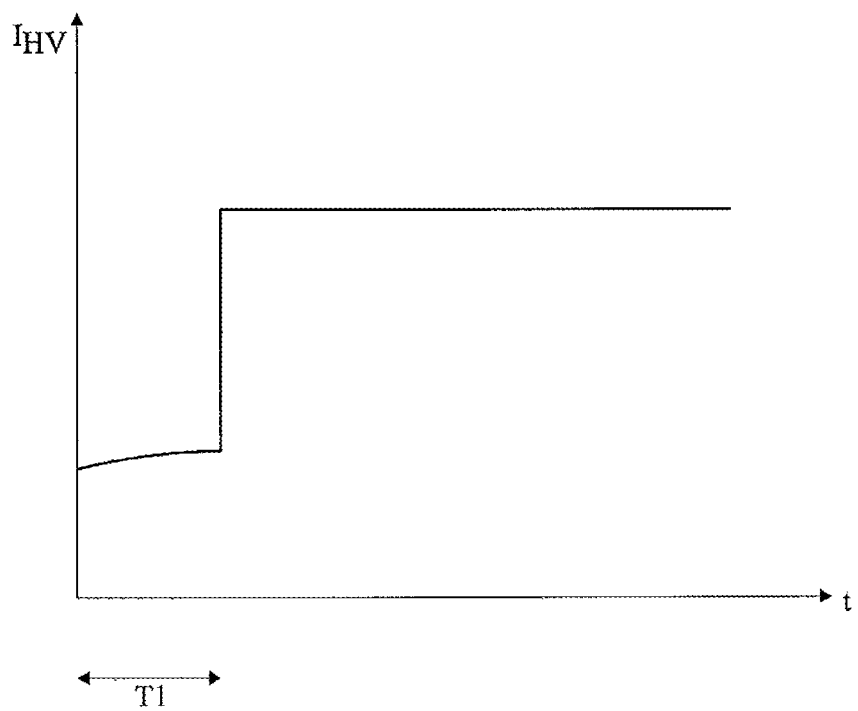
FIG. 2, previously described, shows the current variations in an antifuse during the application of a programming voltage.

Until the breakdown (time T1), as in the case of FIG. 2, input current $I_{HV}$ and output current $I_{BL}$ are substantially equal while current $I_{BULK}$ on terminal BULK is substantially zero. From the end of time T1, considering that there is no element creating a saturation of the current delivered by high-voltage source HV, input current $I_{HV}$ abruptly increases, then uniformly decreases, and the same variation can be observed on current $I_{BULK}$. During this phase, output current $I_{BL}$ is maintained at a constant value due to the saturation of the access transistors and current $I_{HV}$ is equal to $I_{BL}+I_{BULK}$.

The variation of current $I_{BULK}$ from a zero value to a positive value of course depends on the specific considered memory cell, but it will be easy to compare current $I_{BULK}$ to a threshold $I_{TH1}$, which then enables to easily and accurately determine the breakdown time, and thus time T1. Incidentally, it should be noted that the transition detection is easier to perform on current $I_{BULK}$ than on current $I_{HV}$ or on current $I_{BL}$ since the transition on $I_{BULK}$ occurs between zero and a positive value while the transitions of currents $I_{HV}$ and $I_{BL}$ occur between two non-zero values. Further, it is difficult to measure current $I_{HV}$ at the high voltage level since this would require specific measurement devices capable of being connected to the high voltage.

After time T1, current $I_{BULK}$ decreases and the downward transition to a second threshold $I_{TH2}$ greater or smaller than threshold $I_{TH1}$ can again be detected. Experimental studies have shown that the moment (end of time T2) when the antifuse reaches a minimum resistance in the programmed state corresponds to a time at which current $I_{BULK}$ becomes equal to a percentage approximately ranging from 30 to 70% of its maximum value. It is thus provided to interrupt the application of the programming voltage as soon as threshold $I_{TH2}$ selected to correspond to this percentage range has been reached. Account can then be taken of possible variations of time T2 to set the total memory cell programming time.

Figure 5:
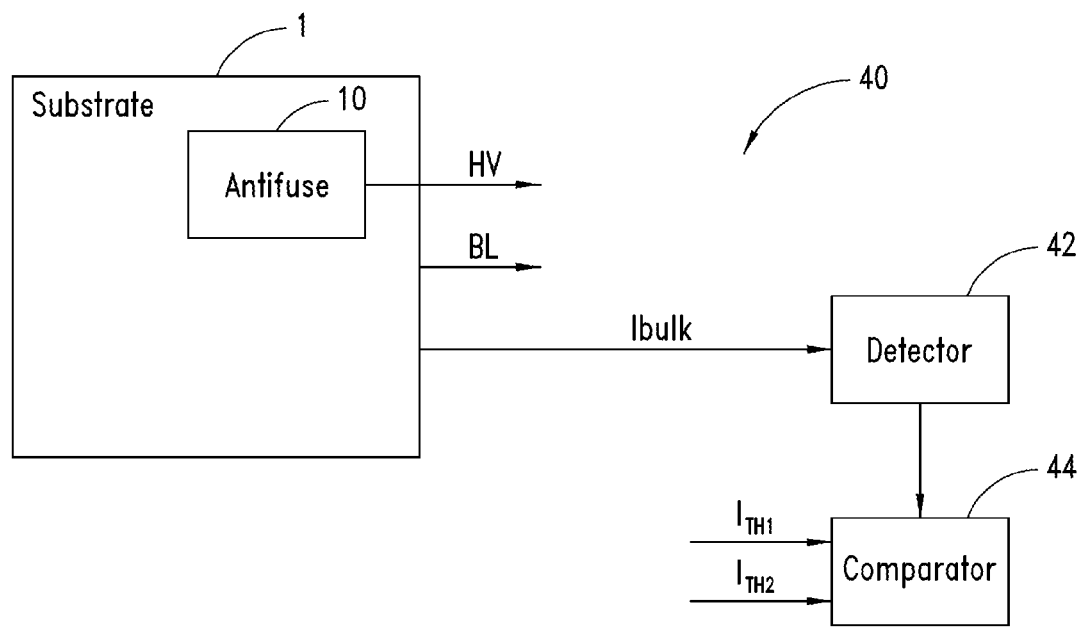
FIGS. 5 and 6 show block diagrams of a devices that include the antifuse memory cell and other components according to embodiments of the present disclosure.

FIG. 5 is a block diagram of a device for controlling the breakdown of the antifuse memory cell 10 formed on a semiconductor substrate, such as the antifuse 10 shown in FIG. 3. The device includes a detector 42 configured to detect the current ($I_{BULK}$) on a substrate terminal 27 and a comparator 44 configured to compare the value of said current ($I_{BULK}$) with a first threshold ($I_{TH1}$) and with a second threshold ($I_{TH2}$) reached in decreasing fashion.

Figure 6:
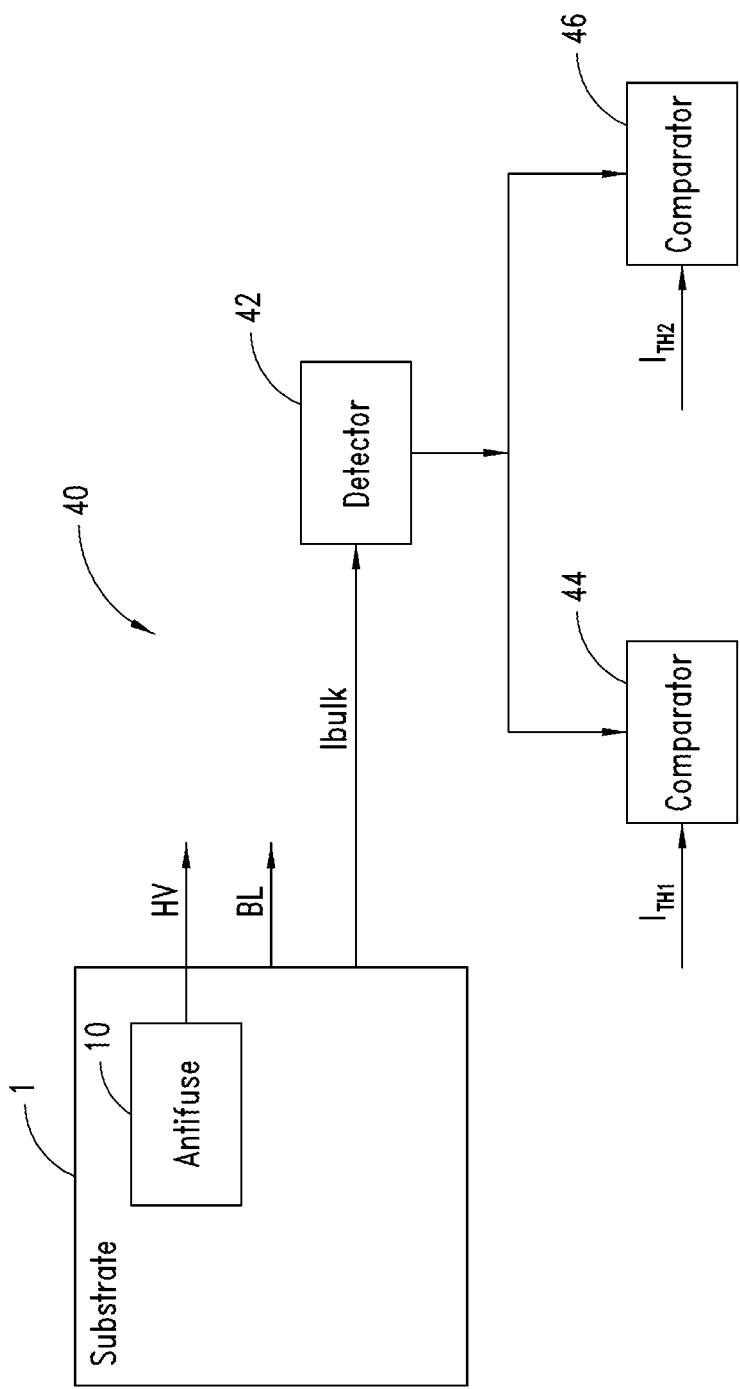

FIG. 6 is a block diagram of a device for controlling the breakdown of the antifuse memory cell 10 formed on a semiconductor substrate, such as the antifuse 10 shown in FIG. 3. The device includes a detector 42 configured to detect the current ($I_{BULK}$) on a substrate terminal 27 and a comparator 44 configured to compare the value of said current ($I_{BULK}$) with a first threshold ($I_{TH1}$). The device may also include a comparator 46 configured to compare the value of said current with a second threshold ($I_{TH2}$) reached in decreasing fashion.

Due to the above-described process, the programming time and the power spent for the programming are decreased given that, in practice, time T1 is greatly variable, for example, from 100 ns to 10 μs, for theoretically identical memory cells which are however different on a wafer or different from one wafer batch to another. Further, this ascertains that the antifuse will have a minimum resistance in the programmed state.

Of course, the foregoing is likely to have many variations.

A specific antifuse memory cell 10 has been described. The present disclosure generally applies to any antifuse memory cell. Different types of antifuse storage elements comprising thin insulating layers of various natures topped with conductive layers of various natures may be used. Similarly, although circuits with two transistors have been described herein as an example, various types of circuits for programming and reading these antifuses may be used.

N- and P-type regions and layers have been mentioned. All conductivity types may be inverted.

No means for measuring current $I_{BULK}$ have been shown or described in detail but it is within the abilities of those skilled in the art to perform a current detection between a terminal and a ground connection of this terminal.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
controlling an antifuse memory cell formed on an active area of a semiconductor substrate, the controlling including:
applying a programming voltage to a terminal of the antifuse memory cell;
detecting a breakdown in the antifuse memory cell, the detecting including detecting a bulk current generated in a portion of the substrate that is outside of the active area; and
interrupting the applying of the programming voltage after a time period after detecting the breakdown, wherein the interrupting includes:
interrupting the applying of the programming voltage in response to detecting the breakdown at a first time; and
interrupting the applying of the programming voltage at a second time equal to the first time plus the time period.

2. The method of claim 1 wherein detecting the breakdown includes comparing the bulk current with a first threshold current and the time period is determined by testing a plurality of antifuse memory cells of determined characteristics.

3. The method of claim 1 wherein:
the active area is a well surrounded by a peripheral insulator, the well being above a buried layer of a first conductivity type that is opposite to a second conductivity type of the well, the buried layer being contacted by a peripheral wall of the first conductivity type that extends from the buried layer to at least partially surround the substrate; and
detecting the current generated in the substrate comprises detecting a bulk current from a bulk terminal formed on a portion of the substrate separated from the active area by the peripheral insulator.

4. The method of claim 3 wherein the antifuse memory cell is formed above a region that is adjacent to one or more MOS transistors, at least one of the one or more MOS transistors being electrically coupled to a reference terminal.

5. The method of claim 1 wherein detecting the breakdown includes detecting an end of a breakdown time by comparing the current generated in the substrate with a first threshold current.

6. A device, comprising:
a substrate having a well of a first conductivity type and a buried layer of a second conductivity type different from the first conductivity type, the well being on the buried layer;
a peripheral insulator surrounding the well;
an antifuse memory cell formed on the semiconductor substrate, above the well surrounded by the peripheral insulator;
a bulk terminal coupled to a portion of the substrate that is separated from the well by the peripheral insulator;
a detector configured to detect a bulk current on the bulk terminal; and
a first comparator configured to detect breakdown of the antifuse memory cell by determining that the bulk current has reached a first threshold at a first time; and
a programming circuit configured to:
apply a programming voltage,
interrupt applying the programming voltage at a second time equal to the first time plus a selected time period.

7. The device of claim 6, further comprising a second comparator configured to compare the substrate current with a second threshold.

8. The device of claim 7, wherein the first comparator is configured to detect that the bulk current exceed the first threshold and the second comparator is configured to detect that the bulk current has decreased down to the second threshold.

9. The device of claim 6, wherein the first comparator is configured to detect that the bulk current exceed the first threshold and is configured to detect that the bulk current has decreased down to a second threshold less than the first threshold.

10. A method, comprising:
controlling an antifuse memory cell formed on an active area of a semiconductor substrate, the controlling including:
applying a programming voltage to a terminal of the antifuse memory cell;
detecting a bulk current generated in a portion of the substrate that is outside of the active area;
determining a breakdown end by detecting when the bulk current reaches a first threshold current;
determining a post-breakdown end by detecting when the bulk current has decreased from the first threshold current to a second threshold current;
interrupting the applying of the programming voltage in response to determining the post-breakdown end, wherein:
the active area is a portion of the substrate that is surrounded by a peripheral insulator at first and second sides of the active area; and
detecting the bulk current generated in the portion of the substrate that is outside of the active area comprises detecting the bulk current from a bulk terminal formed on a portion of the substrate separated from the active area by the peripheral insulator.

11. The method of claim 10 wherein the bulk current at the breakdown end is at a first value and the bulk current at the post-breakdown end is between 30% and 70% of the first value.

12. The method of claim 10 wherein:
the active area is a well; and
the semiconductor substrate comprises a bulk region.

13. The method of claim 12, wherein the well and the bulk region respectively overlie a buried layer of a first conductivity type that is opposite a second conductivity type of the well and bulk region, and wherein a peripheral well of the first conductivity type extends from the buried layer to surround the well and bulk region.

14. The method of claim 10, wherein determining the post-breakdown end by detecting when the bulk current reaches the second threshold current comprises detecting when the bulk current reaches the second threshold current in a decreasing fashion.

* * * * *